(12) United States Patent
Hsu et al.

(10) Patent No.: US 10,066,780 B2
(45) Date of Patent: Sep. 4, 2018

(54) ELEVATION DEVICE

(71) Applicant: JARLLYTEC CO., LTD., New Taipei (TW)

(72) Inventors: Chen-I Hsu, New Taipei (TW); Kun-Yeh Lee, New Taipei (TW)

(73) Assignee: JARLLYTEC CO., LTD., New Taipei (TW)

( * ) Notice: Subject to any disclaimer, the term of this patent is extended or adjusted under 35 U.S.C. 154(b) by 0 days.

(21) Appl. No.: 15/439,398

(22) Filed: Feb. 22, 2017

(65) Prior Publication Data

US 2018/0045361 A1 Feb. 15, 2018

(30) Foreign Application Priority Data

Aug. 10, 2016 (TW) .............................. 105212083 U

(51) Int. Cl.
*F16M 11/00* (2006.01)
*F16M 11/28* (2006.01)
*F16M 11/10* (2006.01)
*H05K 5/02* (2006.01)

(52) U.S. Cl.
CPC ............. *F16M 11/28* (2013.01); *F16M 11/10* (2013.01); *H05K 5/0204* (2013.01); *H05K 5/0234* (2013.01)

(58) Field of Classification Search
CPC ....... F16M 11/28; F16M 11/10; F16M 11/105
See application file for complete search history.

(56) References Cited

U.S. PATENT DOCUMENTS

| | | | | |
|---|---|---|---|---|
| 6,997,422 B2 * | 2/2006 | Sweere | ................ | F16M 11/105 248/123.11 |
| 8,313,074 B2 * | 11/2012 | Wang | ................... | F16M 11/105 248/157 |
| 9,167,707 B1 * | 10/2015 | Wang | ................... | H05K 5/0204 |

* cited by examiner

*Primary Examiner* — Amy J. Sterling
(74) *Attorney, Agent, or Firm* — Guice Patents PLLC

(57) ABSTRACT

An elevation device comprises: a carrier, including an upper vertical frame having the left side and the right side oppositely disposed with a pair of rail slots, wherein one inner wall in each of the rail slots is longitudinally formed with a positioning slot allowing a guide rail to be disposed and positioned; a support seat, including a seat plate having the rear end thereof vertically extended with a pair of wing pieces, wherein backsides of the pair of wing pieces are respectively and longitudinally pivoted with at least one roller, the circumference of each of the at least one roller is formed with a guide slot confining the guide rail, thereby enabling each of the at least one roller to be longitudinally slid along the guide rail; and a constant force spring, formed in a coiled status and connected between the upper vertical frame and the support seat.

12 Claims, 10 Drawing Sheets

ELEVATION DEVICE

BACKGROUND OF THE INVENTION

1. Field of the Invention

The present invention relates to an elevation device, especially to an elevation device having a sliding mechanism.

2. Description of Related Art

A conventional display device, especially a liquid crystal display device, is commonly seen in our daily work places and domestic environments, for matching with the viewing angle required by a user, an elevation angle adjusting function has been provided, and the installation of an elevation device has also been gradually prevailed, so that the display device is able to meet the requirements of users having different body shapes, the height adjustment of the display device can also satisfy the requirements of ergonomics.

Generally speaking, a conventional elevation device used in an object to be supported, for example a display device, has a pair of fixed slide rails disposed at two lateral wall frames arranged above a carrier, a pair of wing pieces at the rear end of a support seat is disposed with a pair of moveable slide rails, so that the pair of moveable slide rails are enabled to be longitudinally slid and displaced along the pair of fixed slide rails for adjusting the height of the display device. The assembly of the pair of fixed slide rails and the pair of moveable slide rails is defined as a slide rail structure which is well known by the skilled people in the art. As a matter of fact, rollers are additionally disposed between the fixed slide rail and the moveable slide rail, so that the moveable slide rail of a roller sliding rail structure is enabled to slide along the fixed slide rail.

Because the above-mentioned slide rail structure is a product with predetermined specifications, for example the slide rail structure having the predetermined specifications of the width being 16 mm or 27 mm is adapted for being assembled with a carrier and a support seat, when an object to be supported, for example a flat monitor, is in a large scale, the slide rail structure with the predetermined specifications is able to work with the lateral frames having the same or slightly wider width and the wing pieces, so the carrier is provided with a sufficient support force and the slide rail structure having the predetermined specifications can be smoothly assembled. However, when the flat monitor is in a small scale or has a very thin thickness, the assembly of the slide rail structure having the same specifications, the carrier and the support seat may be considered as a waste, and the appearance of the carrier is hard to be thinner for being matched with the flat monitor, so that a visual disadvantage of the overly large or overly thick carrier being assembled with a small-scale or thinned flat monitor is caused, thus the above-mentioned disadvantages shall be improved.

Moreover, after the conventional elevation device being used for a period of time, the moveable slide rail of the roller sliding rail structure at one side or both sides may be dislocated due to the applied forces, so the sliding stroke may be shortened, and noises and an intermission feeling may be generated.

Furthermore, the above-mentioned carrier is an integrally-formed metal casting member which has a considerable weight, so the elevation device is hard to be lighter, and the transportation cost is therefore increased.

As such, how to make the sliding mechanism and the carrier of the elevation device to be thinner for being matched with the flat monitor, and to lower the noises and the intermission feeling shall be seriously concerned by the skilled people in the art.

SUMMARY OF THE INVENTION

One primary objective of the present invention is to provide an elevation device, in which with a space design of a pair of wing pieces of a support seat, a carrier allowing each of the wing pieces to be disposed thereon can be thinner for being matched with a thin object to be supported, for example a flat monitor, thereby providing a better appearance.

Another objective of the present invention is to provide an elevation device, which is different from the conventional roller sliding rail structure with predetermined specifications, the elevation device of the present invention is to allow a pair of wing pieces of a support seat to be respectively disposed with at least one roller which works with a guide rail in a pair of rail slots of a carrier, the outer circumference of each of the at least one roller is formed with a guide slot confining the guide rail, so that the formation of gap can be eliminated, noises and an intermission feeling can be lowered, and an operation of being smoothly and longitudinally slid along the guide rail can be facilitated.

For achieving said objectives, one technical solution provided by the present invention is to provide an elevation device, which comprises: a carrier, including an upper vertical frame having the left side and the right side oppositely disposed with a pair of rail slots, wherein one of two opposite inner walls in each of the rail slots is longitudinally formed with a positioning slot allowing a guide rail to be disposed and positioned; a support seat, including a seat plate having the rear end thereof vertically extended with a pair of wing pieces, wherein backsides of the pair of wing pieces are respectively and longitudinally pivoted with at least one roller, the circumference of each of the at least one roller is formed with a guide slot confining the guide rail, thereby enabling each of the at least one roller to be longitudinally slid along the guide rail; and a constant force spring, formed in a coiled status and connected between the upper vertical frame and the support seat.

For achieving said objectives, another technical solution provided by the present invention is to provide an elevation device, which comprises: a carrier, including an upper vertical frame having the left side and the right side oppositely disposed with a pair of rail slots, wherein one of two opposite inner walls in each of the rail slots is longitudinally and integrally formed with a guide rail; a support seat, including a seat plate having the rear end thereof vertically extended with a pair of wing pieces, wherein backsides of the pair of wing pieces are respectively and longitudinally pivoted with at least one roller, the circumference of each of the at least one roller is formed with a guide slot confining the guide rail, thereby enabling each of the at least one roller to be longitudinally slid along the guide rail; and a constant force spring, formed in a coiled status and connected between the upper vertical frame and the support seat.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Referring from FIG. 1 to FIG. 6, the present invention provides an elevation device, which comprises a carrier 1, a support seat 2 and a constant force spring 3.

Figure 2:
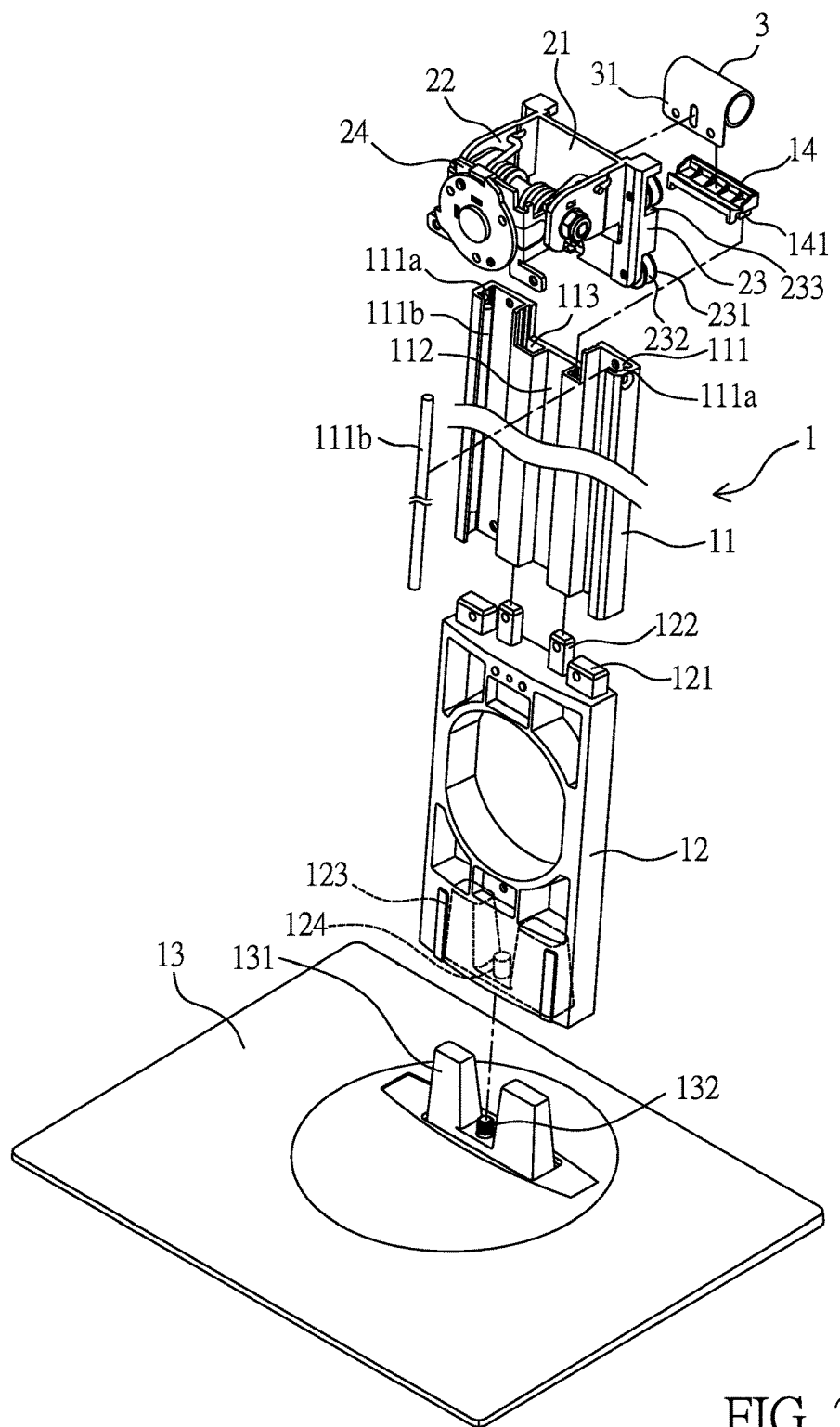
FIG. 2 is a perspective exploded view illustrating the elevation device according to the present invention.

The carrier 1 is formed as a frame member allowing the support seat 2 to be disposed thereon, and the carrier 1 is disposed above a base 13. The carrier 1 includes an upper vertical frame 11 and a lower vertical frame 12 disposed below the upper vertical frame 11. Wherein, the upper vertical frame 11 is preferably to be an elongated plate member formed through an aluminum alloy being extruded, two sides thereof, for example the left and the right sides, are oppositely formed with a pair of rail slots 111. The front side defined between the pair of rail slots 111 is longitudinally and concavely formed with an auxiliary guide slot 112. A pair of insertion slots 113 (as shown in FIG. 2) are formed between the pair of rail slots 111 and arranged adjacent to the pair of rail slots 111, and the pair of insertion slots 113 are arranged at two sides, for example the left and the right sides, of the auxiliary guide slot 112. Because the upper vertical frame 11 is made of an aluminum alloy and formed with the pair of rail slots 111, the auxiliary guide slot 112 and the pair of insertion slots 113, an effect of reducing weight is provided.

Figure 5:
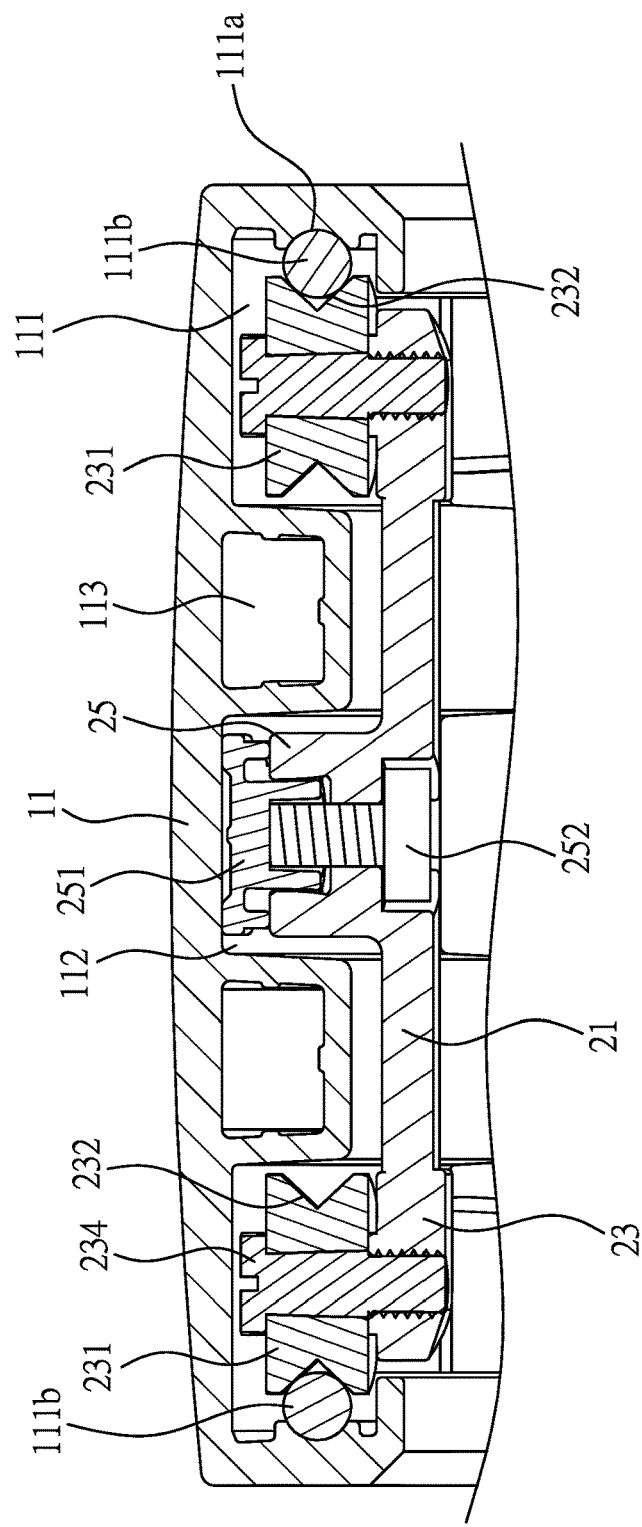
FIG. 5 is a cross sectional view illustrating the assembly of the support seat and the carrier according to the first embodiment of the present invention.

During the process of being guided in and longitudinally slid and elevated between two opposite sides of the support seat 2 and the pair of rail slots 111 of the upper vertical frame 11, one of two opposite inner walls in each of the rail slots 111 is longitudinally formed with a positioning slot 111a allowing a guide rail 111b to be disposed and positioned for decreasing the situations of collision or obliqueness generated due to gaps. As shown in FIG. 5, the guide rail 111b is formed as a round metal rod, and the positioning slot 111a is formed as an arc-shaped recessed slot, thereby enabling the guide rail 111b to be located in the positioning slot 111a without any offset.

Figure 3:
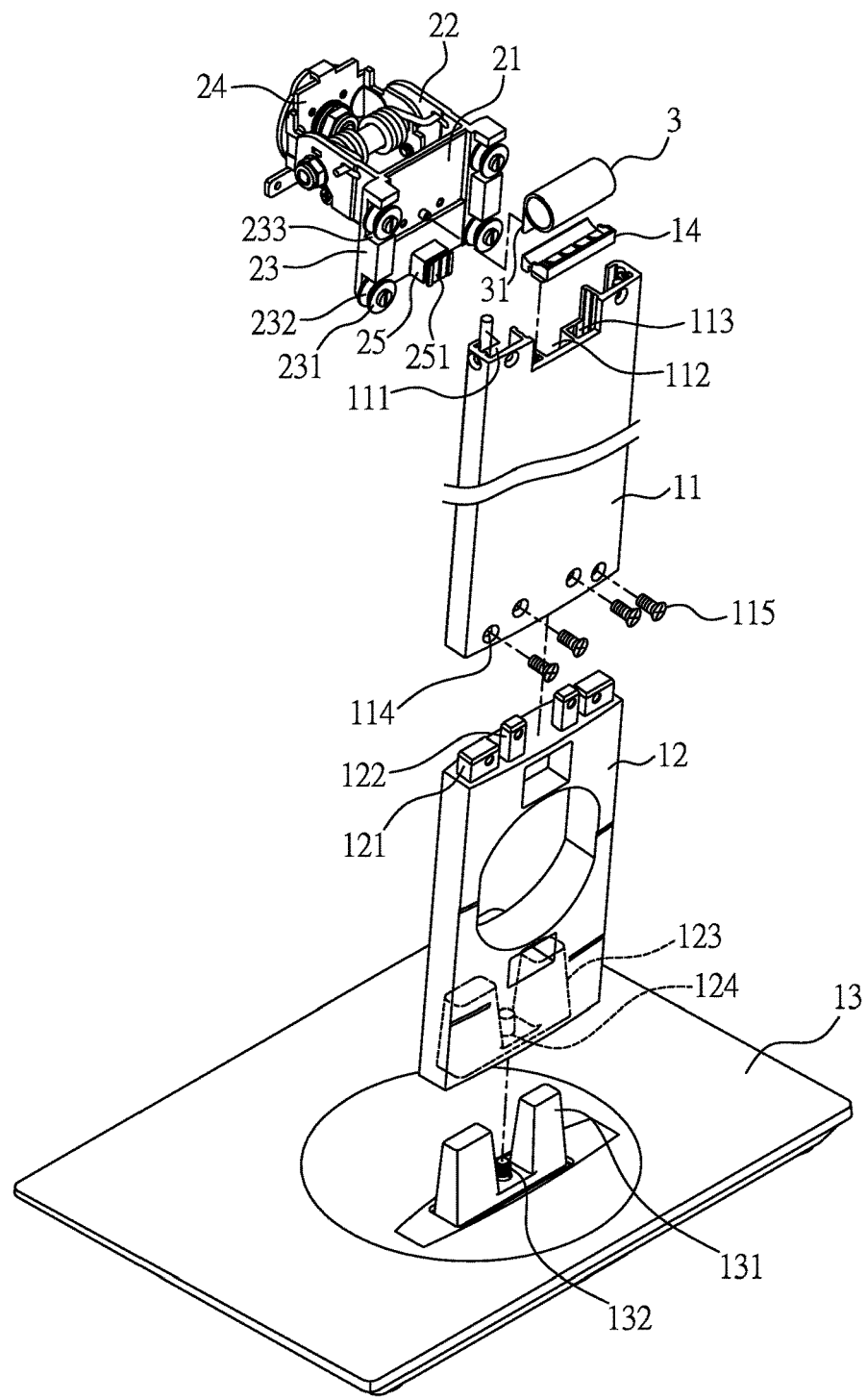
FIG. 3 is another perspective exploded view illustrating the elevation device according to the present invention.

The lower vertical frame 12 is preferably to be an elongated plate member made of a metal casting unit, the top end thereof is respectively formed with a pair of first insertion tenons 121 allowing the pair of rail slots 111 to be inserted and a pair of second insertion tenons 122 allowing the pair of insertion slots 113 to be inserted, and the bottom end defined on the backside of the upper vertical frame 11 is respectively formed with a first penetrated hole 114 (as shown in FIG. 3) corresponding to the locations of the first insertion tenons 121 and the second insertion tenons 122, so that a first fastening member 115, for example a bolt, is able to pass each of the first penetrated holes 114 and be locked in the first insertion tenons 121 and the second insertion tenons 122, thereby enabling the upper vertical frame 11 to be connected to the top end of the lower vertical frame 12 so as to be combined as one piece.

For enabling the lower vertical frame 12 to be fastened on the top surface of the base 13, the bottom surface of the lower vertical frame 12 is longitudinally formed with at least one insertion hole 123 and at least one connection hole 124 (shown as dashed lines in FIG. 3), the top surface of the base 13 is formed with at least one positioning tenon 131 inserted in the at least one insertion hole 123 and at least one second fastening member 132, for example a bolt, penetrating the base 13 and fastened in the at least one connection hole 124. As such, the carrier 1 is able to be vertically disposed on the top surface of the base 13.

In addition, for allowing the constant force spring 3 to be disposed, a spring seat 14 is disposed on the top end of the upper vertical frame 11, the bottom surface of the spring seat 14 is formed with a pair of positioning tenons 141 allowing the pair of insertion slots 113 to be inserted and positioned, and the top end thereof is formed with an arc-shaped concave part 142, the arc-shaped concave part 142 is served to allow the constant force spring 3 in a coiled status to be received, and one free end 31 of the constant force spring 3 is connected to the support seat 2.

Figure 4:
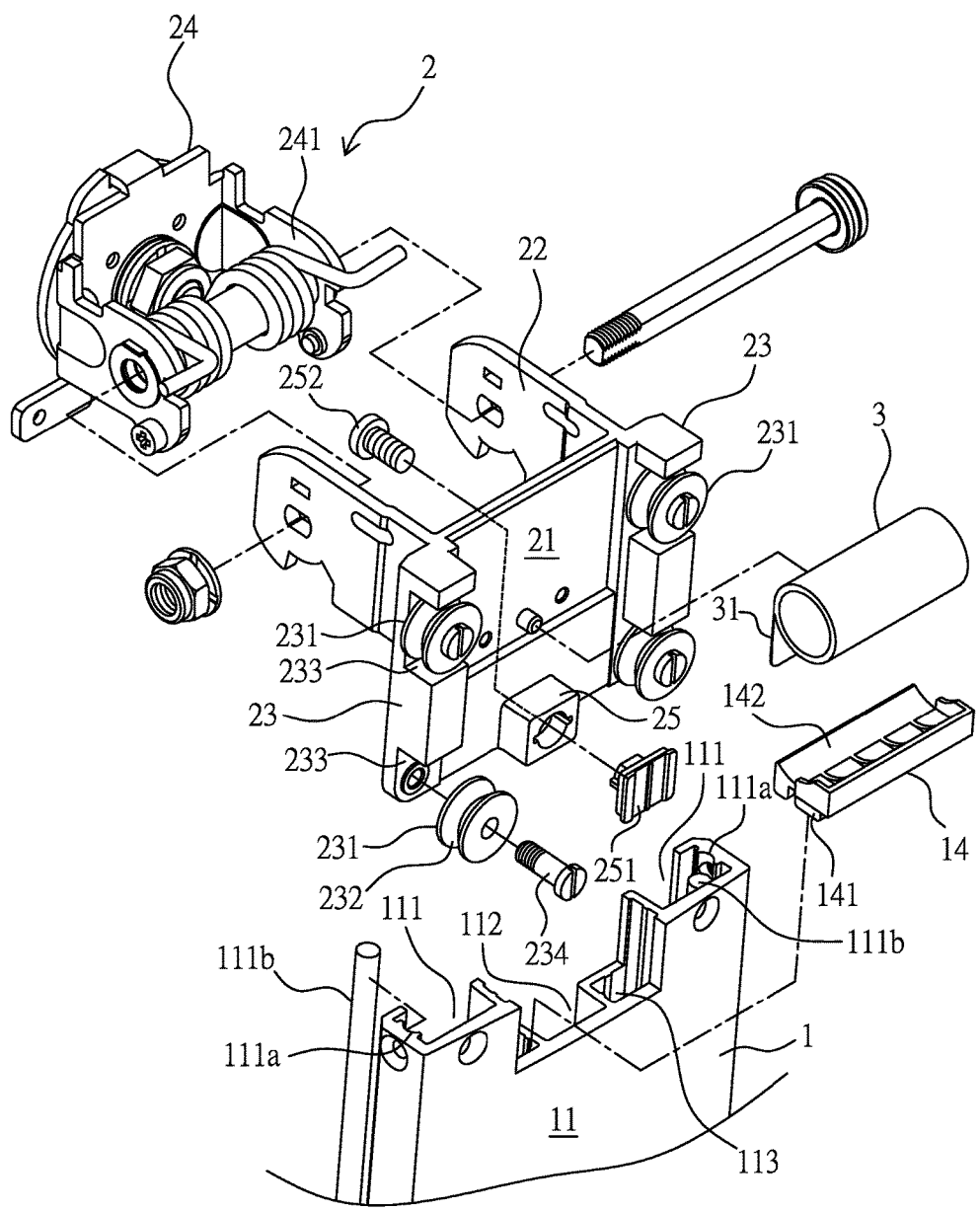
FIG. 4 is a perspective exploded view illustrating a support seat being connected to a carrier according to a first embodiment of the present invention.
Figure 6:
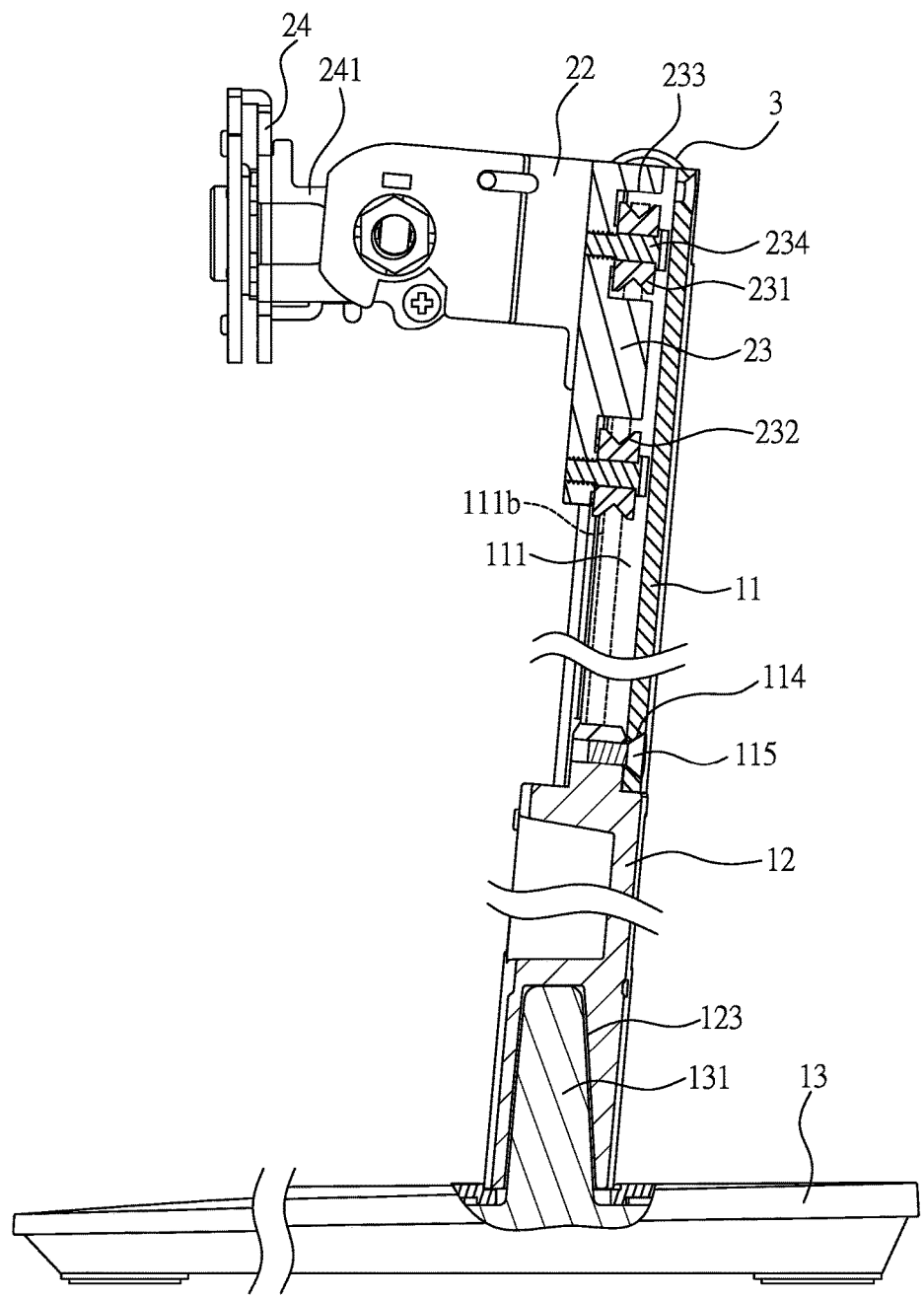
FIG. 6 is a cross sectional view of FIG. 1 taken along an A-A line.

As shown from FIG. 4 to FIG. 6, the support seat 2 is served to allow an object to be supported, for example a flat monitor, to be connected, the support seat 2 includes a seat plate 21, the front end and the rear end of the seat plate 21 are respectively extended with a pair of connection arms 22 and a pair of wing pieces 23 which are perpendicular to each other. The pair of wing pieces 23 are confined in the pair of rail slots 111, and the backsides of the pair of wing pieces 23 are respectively and longitudinally pivoted with at least one roller 231, as shown in FIG. 4 and FIG. 5, there are two rollers 231 disposed on each of the wing pieces 23, and the rollers 231 are longitudinally spaced with intervals and arranged in a row-like format. Wherein, for decreasing the situations of collision or obliqueness generated due to gaps, the outer circumference of each of the at least one roller 231 is formed with a guide slot 232 confining the guide rail 111b, so that a clamping effect is formed between the at least one roller 231 at two opposite sides of the support seat 2 and the guide rail 111b in each of the rail slots 111 of the upper vertical frame 11 (as shown in FIG. 5), thus the formation of gaps can be eliminated and noises can be reduced, and a rolling contact status is formed between each of the guide rails 111b and the guide slot 232 of each of the at least one roller 231, so that each of the at least one roller 231 is able to be longitudinally slid in the guide rail 111b of each of the rail slots 111. Wherein, the guide slot 232 is preferably to be formed in a V-like shape for being easier to be clamped and forming the rolling contact status with the guide rail 111b, and a feature of matching the dimension of the guide rail 111b is provided, thus the roller 231 is preferably to be formed as a V-shaped bearing in actual practice.

As shown in FIG. 4, for allowing the rollers 231 to be easily disposed on the pair of wing pieces 23, the pair of wing pieces 23 are respectively formed with at least one roller slot 233 corresponding to the location of each of the at least one roller 231, then a third fastening member 234 is served to pass and be locked in the roller slot 233. Because the pair of wing pieces 23 are disposed in the pair of rail slots 111, the support seat 2 is enabled to be longitudinally elevated at the front side of the upper vertical frame 11.

The front end of the pair of connection arms 22 is pivoted with an adjustment member 24, the adjustment member 24 is backwardly extended with a pair of swing arms 241, and a conventional rotation shaft structure is served to pivot the pair of connection arms 22 and the pair of swing arms 241 which are adjacently arranged, so that the adjustment member 24 is able to upwardly/downwardly swing relative to the support seat 2.

Moreover, the backside of the seat plate 21 includes a guide protrusion 25 received in the auxiliary guide slot 112; because each of the guide rails 111b bears the weight of the support seat 2 and the weight of the object to be supported through each of the corresponding rollers 231, a wearing resistant member 251 formed as a cap member and made of polyoxymethylene (POM) is disposed on the guide protrusion 25 for prolonging the service life thereof, so that a contact status is formed between the wearing resistant member 251 and the auxiliary guide slot 112, and a connection member 252, for example a bolt, is served to pass the guide protrusion 25 and to be connected to the wearing resistant member 251, and the wearing resistant member 251 is adjusted for being in a constant contact status with the auxiliary guide slot 112 with respect to the weight of the object to be supported, thus a support effect is formed for sharing the bearing load, and an advantage of prolonging the service life of each of the guide slots 111b is also provided.

The constant force spring 3 is a conventional spring, and a circular part thereof in a coiled status is received in the arc-shaped concave part 142 of the spring seat 14, the free end 31 of the constant force spring 3 is downwardly extended and fastened in the seat plate 21, an elastic force provided by the constant force spring 3 is sufficient enough to support the weight of the support seat 2 and the weight of the object to be supported, for example a flat monitor, so that the object to be supported and the support seat 2 can both be longitudinally elevated and stopped for being positioned at the front side of the carrier 1.

Figure 1:
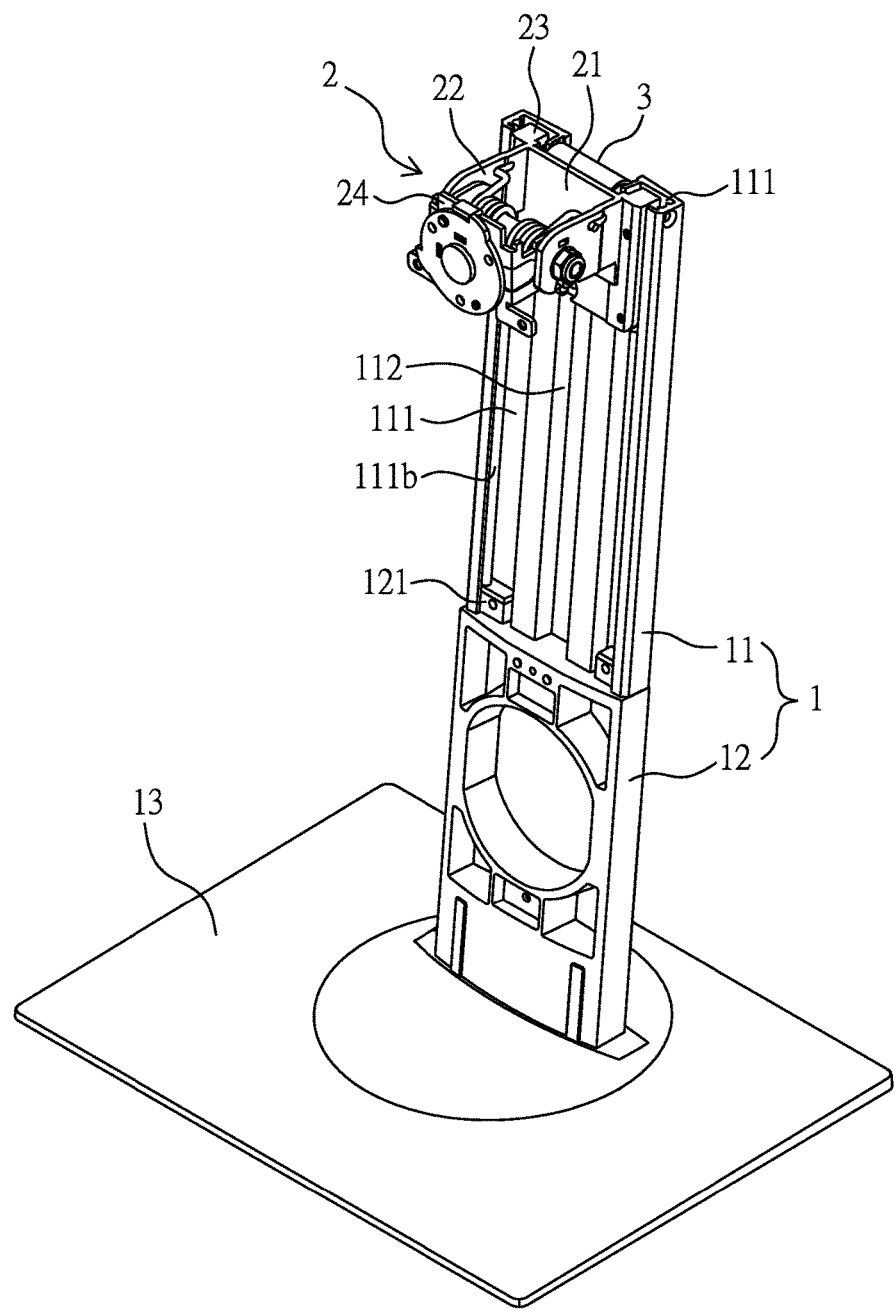
FIG. 1 is a perspective view illustrating an elevation device according to the present invention.

Based on what has been disclosed for each of the components and the assembling relations thereof, the assembly is shown in FIG. 1, the support seat 2 utilizes each of the at least one roller 231 disposed on each of the wing pieces 23 to be longitudinally slid along the guide rail 111b in each of the rail slots 111, the constant force spring 3 is connected to the support seat 2 and the upper vertical frame 11, so that the constant force spring 3 is able to constantly provide an upward action force to the support seat 2 so as to be balanced with the gravity of the object to be supported, for example a flat monitor, thereby enabling the support seat 2 to be stably and smoothly and longitudinally elevated at the front side of the upper vertical frame 11.

As shown in FIG. 5 and FIG. 6, each of the at least one roller 231 is arranged adjacent to the guide rail 111b in each of the rail slots 111, in other words the roller 231 of each of the wing pieces 23 is respectively abutted against the guide rail 111b in each of the rail slots 111, the support seat 2 is clamped by the pair of guide rails 111b which are oppositely disposed, so that during the sliding process, the guide slot 232 of each of the at least one roller 231 is in constant contact with each of the guide rails 111b with a rolling means, thereby allowing a longitudinal elevation adjustment to be stably processed.

Figure 7:
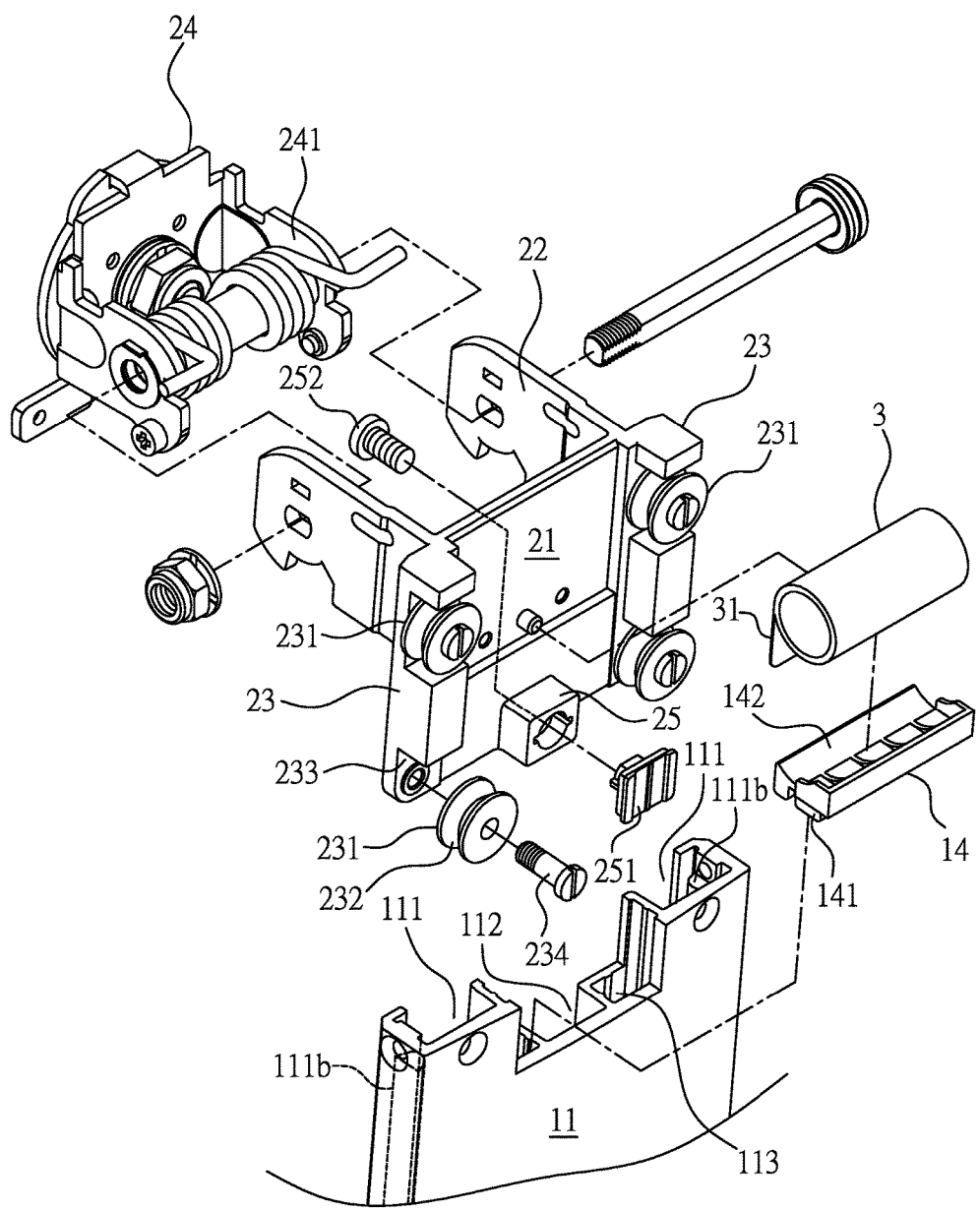
FIG. 7 is a perspective exploded view illustrating the support seat being connected to the carrier according to a second embodiment of the present invention.
Figure 8:
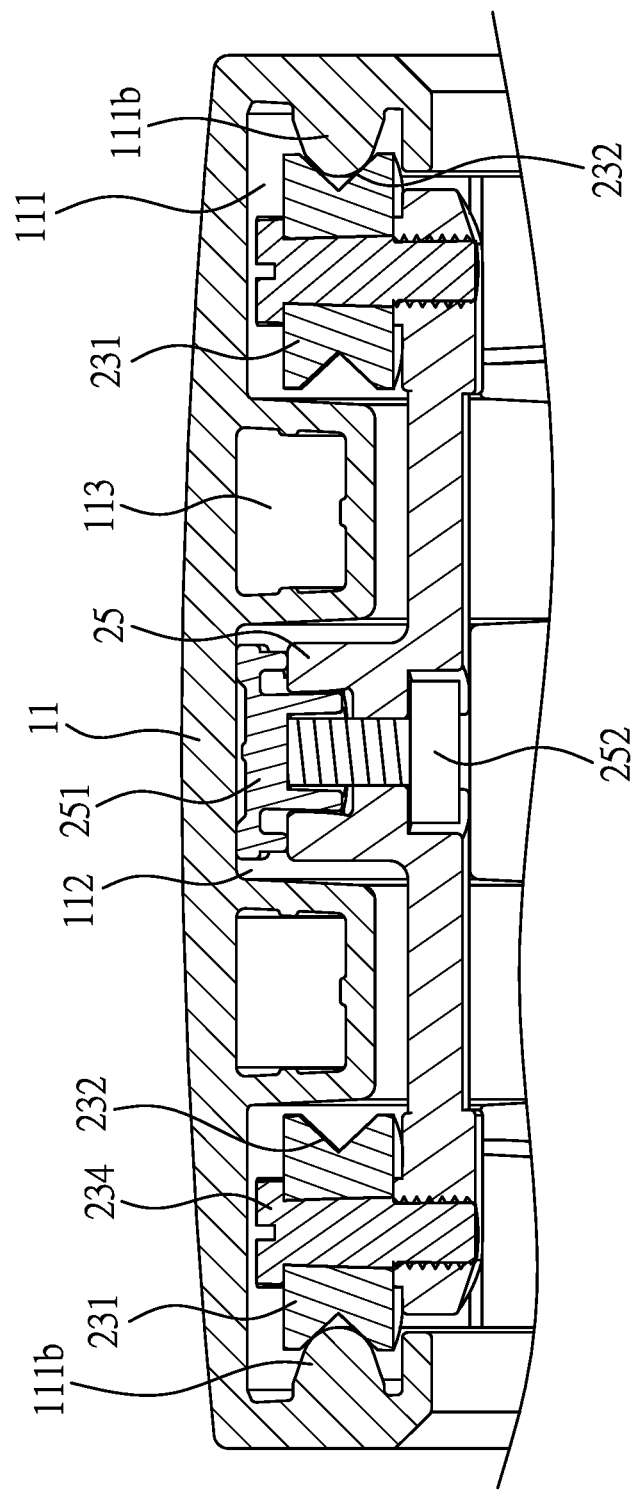
FIG. 8 is a cross sectional view illustrating the assembly of the support seat and the carrier according to the second embodiment of the present invention.

Referring to FIG. 7 and FIG. 8, which disclose a second embodiment of the support seat, the same codes adapted in the first embodiment are defined as the same components disclosed in the second embodiment, because many components are shared in both of the second embodiment and the first embodiment, only the differences between the above two are provided as followings.

According to the second embodiment, the guide rail 111b is integrally and longitudinally formed on one of two opposite inner walls in each of the rail slots 111, so that the positioning slot 111a, which is disclosed in the first embodiment and allows the guide rail 111b to be disposed and positioned, is not required, thus an objective of reducing components is achieved, and the assembling procedure is also simplified.

Figure 9:
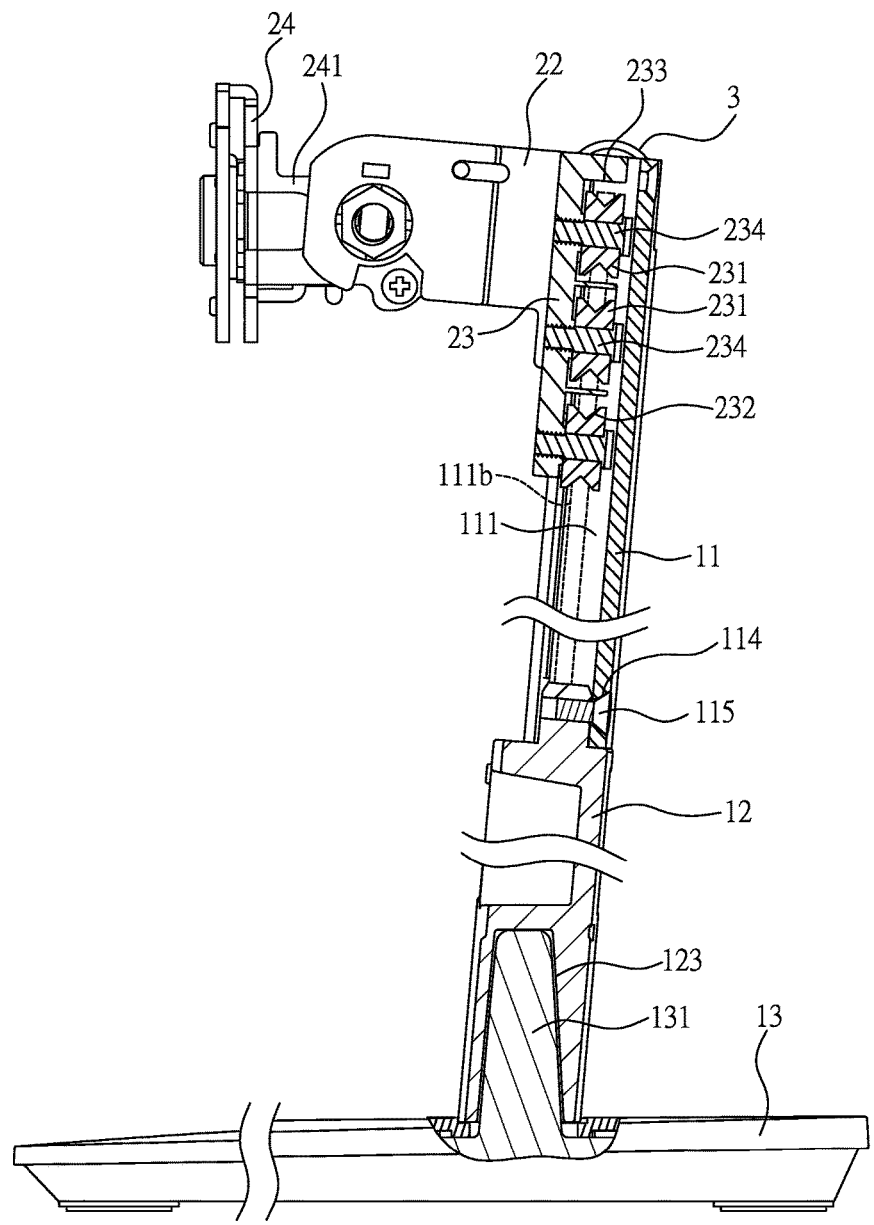
FIG. 9 is a cross sectional view illustrating an alternative of the support seat according to the present invention.

Referring to FIG. 9, by increasing the quantity of the roller slots 233 formed in each of the wing pieces 23, for example increasing the quantity to three, each of the at least one roller 231 is able to be disposed in the selected roller slot 233, and the bearing load can be shared through the quantity of the rollers 231 being corresponding to the quantity of the roller slots 233, so that a smooth longitudinal elevating operation can be provided.

Figure 10:
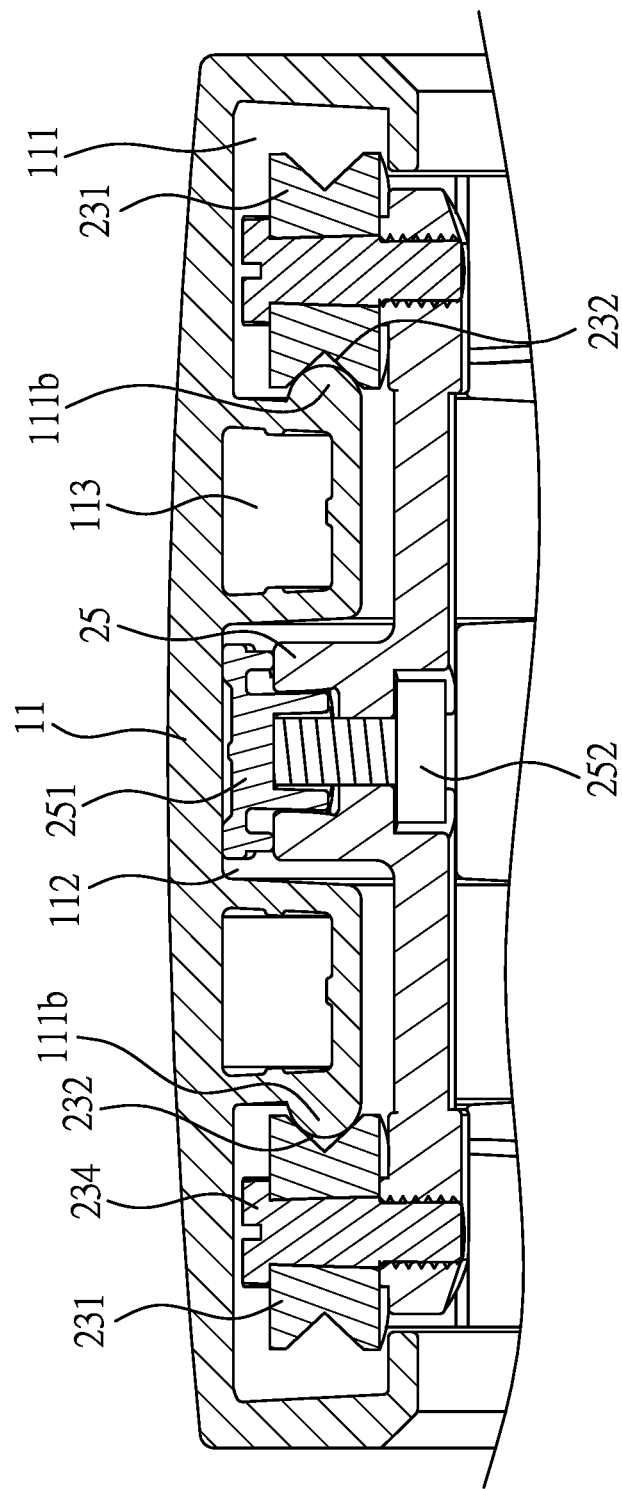
FIG. 10 is a cross sectional view illustrating an alternative of the upper vertical frame according to the present invention.

Referring to FIG. 10, the disposed location of the guide rail 111b in each of the rail slots 111 is not limited to the outer side of each of the rail slots 111, in other words the arrangement of the guide rail 111b being disposed at the inner side of each of the rail slots 111 shall be within the scope of the present invention.

Advantages achieved by the present invention are as follows: with the arrangement of the pair of wing pieces and the rollers thereof, the wing pieces are enabled to be smoothly and longitudinally slid and elevated in the pair of rail slots of the upper vertical frame, so that not only the service life is prolonged, noises can also be effectively reduced, the conventional specified slide rail structure can be replaced, and the production cost can be effectively lowered with the design of less components provided by the present invention; moreover, with the space design of the pair of wing pieces, the upper vertical frame allowing the support seat to be disposed can be designed to be thinner and lighter, and by having the lower vertical frame having the same thickness to be matched with the upper vertical frame, the carrier and the thinned object to be supported, for example the flat monitor, can be seen as an integral design for providing a better appearance. Accordingly, the elevation device provided by the present invention is novel and more practice in use comparing to prior art.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific examples of the embodiments disclosed and that modifications and other embodiments are intended to be included within the scope of the appended claims. Although specific terms are employed herein, they are used in a generic and descriptive sense only and not for purposes of limitation.

What is claimed is:
1. An elevation device, comprising:
   a carrier, including an upper vertical frame having a left side and a right side oppositely disposed with a pair of rail slots, wherein one of two opposite inner walls in each of said rail slots is longitudinally formed with a positioning slot allowing a guide rail to be disposed and positioned;

a support seat, including a seat plate having a rear end thereof vertically extended with a pair of wing pieces, wherein backsides of said pair of wing pieces are respectively and longitudinally pivoted with at least one roller, a circumference of each of said at least one roller is formed with a guide slot confining said guide rail, thereby enabling each of said at least one roller to be longitudinally slid along said guide rail; and a constant force spring, formed in a coiled status and connected between said upper vertical frame and said support seat;

wherein said positioning slot is formed as an arc-shaped recessed slot, and said guide rail is formed as a round metal rod.

2. The elevation device as claimed in claim 1, wherein said at least one roller is formed as a V-shaped bearing for easily clamping said guide rail and forming a rolling contact with said guide rail.

3. The elevation device as claimed in claim 1, wherein said guide slot of said at least one roller is formed in a V shape for easily clamping said guide rail and forming a rolling contact with said guide rail.

4. The elevation device as claimed in claim 1, wherein said pair of wing pieces are respectively formed with at least one roller slot for accommodating said at least one roller, and each of said at least one roller is inserted with a third fastening member and gets locked in one of said at least one roller slot thereby.

5. The elevation device as claimed in claim 1, wherein said carrier further includes a lower vertical frame disposed below said upper vertical frame, said lower vertical frame is fastened on a top surface of a base, wherein said upper vertical frame is an elongated plate member formed through an aluminum alloy being extruded, and said lower vertical frame is an elongated plate member made of a metal casting unit.

6. The elevation device as claimed in claim 5, wherein a top end of said lower vertical frame is formed with a pair of first insertion tenons allowing said pair of rail slots to be inserted; a pair of insertion slots are formed between said pair of rail slots and arranged adjacent to said pair of rail slots, and a top end of said lower vertical frame is further formed with a pair of second insertion tenons allowing said pair of insertion slots to be inserted.

7. The elevation device as claimed in claim 6, wherein a bottom end defined on a backside of said upper vertical frame is respectively formed with a first penetrated hole corresponding to locations of said first insertion tenons and said second insertion tenons, and a first fastening member is served to pass each of said first penetrated holes and to be locked in said first insertion tenons and said second insertion tenons.

8. The elevation device as claimed in claim 5, wherein a bottom surface of said lower vertical frame is longitudinally formed with at least one insertion hole and at least one connection hole, a top surface of said base is formed with at least one positioning tenon inserted in said at least one insertion hole and at least one second fastening member penetrating said base and fastened in said at least one connection hole.

9. The elevation device as claimed in claim 1, wherein a front side defined between said pair of rail slots is longitudinally and concavely formed with an auxiliary guide slot, and a backside of said seat plate includes a guide protrusion received in said auxiliary guide slot.

10. The elevation device as claimed in claim 9, wherein a backside of said guide protrusion is combined with a wearing resistant member, so that said wearing resistant member is enabled to be in contact with said auxiliary guide slot.

11. The elevation device as claimed in claim 1, wherein said upper vertical frame further includes a spring seat, a pair of insertion slots are formed between said pair of rail slots and arranged adjacent to said pair of rail slots, a bottom surface of said spring seat is formed with a pair of positioning tenons allowing said pair of insertion slots to be inserted and positioned, and a top end thereof is formed with an arc-shaped concave part allowing said constant force spring to be received.

12. The elevation device as claimed in claim 1, wherein a front end of said seat plate is extended with a pair of connection arms, said pair of connection arms is arranged adjacent to a pair of swing arms backwardly extended from an adjustment member, a rotation shaft structure is served to pivot said pair of connection arms and said pair of swing arms, so that said adjustment member is able to upwardly/downwardly swing relative to said support seat.

* * * * *